(12) United States Patent
Koide

(10) Patent No.: US 7,301,230 B2
(45) Date of Patent: Nov. 27, 2007

(54) CIRCUIT BOARD WITH A THIN-FILM LAYER CONFIGURED TO ACCOMMODATE A PASSIVE ELEMENT

(75) Inventor: Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 282 days.

(21) Appl. No.: 11/020,226

(22) Filed: Dec. 27, 2004

(65) Prior Publication Data
US 2006/0056162 A1    Mar. 16, 2006

(30) Foreign Application Priority Data
Sep. 10, 2004    (JP) .............................. 2004-263729

(51) Int. Cl.
*H01L 23/12*    (2006.01)
*H05K 1/18*    (2006.01)

(52) U.S. Cl. .............................. 257/700; 257/E23.173; 361/763; 361/782

(58) Field of Classification Search ................. 361/763
See application file for complete search history.

(56) References Cited

U.S. PATENT DOCUMENTS

| 5,517,758 | A | 5/1996 | Nakamura |
| 5,808,878 | A | 9/1998 | Saito et al. .................. 361/818 |
| 6,043,987 | A | 3/2000 | Goodwin et al. ............ 361/763 |
| 6,467,692 | B1 | 10/2002 | Tarantino et al. ............ 235/492 |
| 2002/0047749 | A1 | 4/2002 | Sugawara .................... 331/158 |
| 2003/0047809 | A1* | 3/2003 | Takeuchi et al. ............ 257/758 |

FOREIGN PATENT DOCUMENTS

| JP | 5-335744 | 12/1993 |
| JP | 9-8175 | 1/1997 |
| JP | 10-22645 | 1/1998 |
| JP | 10-70368 | 3/1998 |
| JP | 10-341081 | 12/1998 |
| JP | 11-17326 | 1/1999 |

OTHER PUBLICATIONS

N. Wakabayashi; "The trend and technical development of a high-density multilayer resin substrate package;" NE/NµD Hardware Conference 2002; May 30, 2002; draft paper (6 sheets) with extract./Discussed in the specification.
European Search Report dated Jun. 27, 2007.
Notice of Reasons for Rejection dated Jul. 3, 2007 corresponding to Japanese patent application No. 2004-263729.

* cited by examiner

*Primary Examiner*—Stephen W. Smoot
(74) *Attorney, Agent, or Firm*—Kratz, Quintos & Hanson, LLP

(57) ABSTRACT

A laminating step includes a second step of laminating a second insulation layer on a conductive pattern last formed at a first step, roughening the surface of the laminated second insulation layer excluding a desired area, and forming a conductive layer on at least the desired area of the surface of the second insulation layer, and a processing step includes a removing step of removing an upper part of the area higher than the second insulation layer on the substrate obtained at the laminating step, and an exposing step of exposing a part of the area of a conductive pattern adjacent to the lower side of the second insulation layer.

4 Claims, 19 Drawing Sheets

CIRCUIT BOARD WITH A THIN-FILM LAYER CONFIGURED TO ACCOMMODATE A PASSIVE ELEMENT

BACKGROUND OF THE INVENTION

1. Field of the Invention

The present invention relates to a method of manufacturing a substrate including a laminating step of obtaining a multilayer substrate having an insulation layer and a conductive pattern laminated alternately, and a processing step of processing the substrate obtained at the laminating step, and a circuit board.

2. Description of the Related Art

As a representative method of manufacturing a multilayer substrate, what is called a buildup method is known for alternately laminating an insulation layer and a wiring such as a power source line and a ground line or a conductive pattern as a pad, on a core board (refer to Japanese Patent Application Publication No. 5-335744 and Japanese Patent Application Publication No. 10-341081, for example). Particularly, according to the buildup methods described in the Japanese Patent Application Publication No. 5-335744 and Japanese Patent Application Publication No. 10-341081, in order to increase the degree of adhesion between the insulation layer and the conductive pattern, the whole surface of the insulation layer is roughened, and the conductive pattern is formed on this rough surface of the insulation layer.

When an LSI (large scale integration) chip is mounted on the obtained multilayer substrate, a noise reduction element to reduce noise between the power source line and the ground line is also mounted in some cases. To increase a noise reduction rate according to the noise reduction element, the noise reduction element should be mounted on the substrate as close to the LSI chip as possible. For this purpose, a technique of embedding chip capacitors into the core board is proposed (refer to NE/NμD Hardware Conference 2002 (held by Nikkei Electronics and Nikkei Micro Device) draft paper, "The trend and technical development of a high-density multilayer resin substrate package", Nobukazu Wakabayashi, May 30, 2002, pp. 3-16, for example).

FIG. 19 is a schematic diagram of a circuit board having chip capacitors embedded into the core board by applying the technique described in the above literature at the NE/NμD Hardware Conference 2002.

FIG. 19 shows a state that a circuit board 1' is mounted on a mother board 9'. FIG. 19 also shows a core board 3', and buildup layers 4' provided on both the upper surface and the lower surface of the core board 3', to constitute the circuit board 1'. An LSI chip 2' is mounted on the surface of the circuit board 1' shown in FIG. 19. Chip capacitors 5' embedded in the core board 3' are connected to the LSI chip 2' through via holes 6'.

To manufacture the circuit board 1' shown in FIG. 19, a groove 3'a is first formed on the surface of the core board, and the chip capacitors 5' are put into the groove 3'a. The chip capacitors 5' are fixed to the groove 3'a with an adhesive or the like. A resin is poured into the groove 3'a to fill the groove 3'a with the resin. The buildup layer 4' is formed on the surface of the core board. The via holes 6' are formed in the buildup layer 4' to electrically connect the LSI chip 2' with the chip capacitors 5'.

However, in order to embed the chip capacitors 5' into the core board 3', the upper surface of the chip capacitors 5' and the upper surface of the core board 3' need to be at the same level. Therefore, a high-precision processing technique is necessary to form the groove 3'a on the core board 3'. Positioning in the lateral direction of the chip capacitors 5' also requires high precision. When a void is created in the resin that is poured into the grooves 3'a, air in the void is heated and blows out at the subsequent soldering, which has a risk of internal breakage of the circuit board. When the surface of the resin filled in the groove 3'a cannot secure sufficient flatness, the buildup layer 4' swells, creating a risk of poor yield in the connection of fine LSI bumps.

SUMMARY OF THE INVENTION

The present invention has been made in view of the above circumstances, and provides a method of manufacturing a substrate capable of easily manufacturing a circuit board on which a passive element such as a noise reduction element can be mounted as close to an LSI chip as possible, and provides a circuit board on which a passive element such as a noise reduction element can be mounted as close to an LSI chip as possible.

According to a first aspect of the present invention, there is provided a method of manufacturing a substrate including a laminating step of obtaining a multilayer substrate having an insulation layer and a conductive pattern laminated alternately, and a processing step of processing the substrate obtained at the laminating step, wherein.

the laminating step includes a first step of forming a first insulation layer, roughening the whole surface of the formed first insulation layer, and forming a desired conductive pattern on the roughened surface of the first insulation layer, as one cycle, or further forming the next first insulation layer on the formed conductive pattern, thereby repeating the cycle more than once, a second step of laminating a second insulation layer on the conductive pattern last formed at the first step, roughening the surface of the laminated second insulation layer excluding a desired area, and forming a conductive layer on at least the desired area of the surface of the second insulation layer, and a third step of forming a third insulation layer on the conductive layer formed at the second step, roughening the whole surface of the formed third insulation layer, and forming a desired conductive pattern on the roughened surface of the third insulation layer, as one cycle, or further forming the next third insulation layer on the formed conductive pattern, thereby repeating the cycle more than once, and the processing step includes a removing step of removing an upper part of the area higher than the second insulation layer on the substrate obtained at the laminating step, and an exposing step of exposing a part of the area of a conductive pattern adjacent to the lower side of the second insulation layer.

According to the above aspect of the present invention, at the laminating step, the adhesion between the second insulation layer and the area is kept low, while the adhesion between the first insulation layer and the conductive pattern is kept high. With this arrangement, at the removing step of the processing step, the upper part of the area higher than the second insulation layer on the substrate obtained at the laminating step can be removed easily. For example, when the part is cut in by perforating along the external periphery of the part, this part can be easily removed from the second insulation layer, because the adhesion between the second insulation layer and the area is kept low. The second insulation layer is exposed where the part is removed on the substrate after ending the removing step. A distance from the exposed surface of the second insulation layer to the part in the area of the conductive pattern adjacent to the lower side of the second insulation layer is very small. Therefore, at the exposing step, the part in the area of the conductive pattern adjacent to the lower side of the second insulation layer can be exposed by laser processing or chemical processing, without a mechanical cut processing. As a result, a part of the conductive pattern can be exposed in a short time at low cost, without scattering a cut waste of the conductive pattern or roughening a part of the surface of the conductive pattern.

According to the substrate manufactured in this way, when a noise reduction element is connected to the part in the area of the conductive pattern exposed at the exposing step, the semiconductor chip can be brought close to the noise reduction element, corresponding to the thickness of the part removed at the removing step.

The noise reduction element can be a chip capacitor. The substrate manufacturing method according to the present invention can be also applied to a method of manufacturing a circuit board on which a passive element is mounted, in addition to the noise reduction element.

The first step can be a step of forming a desired conductive pattern by electric plating, and the second step can be a step of forming a conductive layer by electroless plating.

According to another aspect of the present invention, a circuit board includes a core board, and a buildup layer having an insulation layer and a conductive pattern laminated alternately on the core board, wherein the buildup layer is configured such that a part of a layer, accommodating a passive element, higher than a conductive pattern to be connected present in a layer lower than the top layer, to which the passive element is to be connected, is removed, thereby exposing the conductive pattern to be connected.

According to the circuit board of the present invention, the semiconductor chip can be brought close to the noise reduction element, corresponding to the thickness of the removed part.

The circuit board according to the present invention can have a passive element such as a chip capacitor that is connected to the conductive pattern to be scheduled and is accommodated in the part. Further, the circuit board can have a semiconductor chip connected to the chip capacitor.

The present invention provides a substrate manufacturing method capable of easily manufacturing a circuit board on which a passive element such as a noise reduction element can be mounted as close to an LSI chip as possible, and provides a circuit board on which a passive element such as a noise reduction element can be mounted as close to an LSI chip as possible.

DETAILED DESCRIPTION OF THE INVENTION

A method of manufacturing a substrate according to an embodiment of the present invention is described below. The method of manufacturing a substrate according to the present embodiment has broadly three steps including a laminating step of obtaining a multilayer substrate by alternately laminating an insulation layer and a conductive pattern, a processing step of processing the substrate obtained at the laminating step, and a noise reduction element mounting step of mounting a noise reduction element.

The laminating step is first explained. At the laminating step, a first step is carried out. The first step includes forming a first insulation layer, roughening the whole surface of the formed first insulation layer, and forming a desired conductive pattern on the roughened surface of the first insulation layer, as one cycle, or further forming the next first insulation layer on the formed conductive pattern, thereby repeating the cycle more than once.

Figure 1:
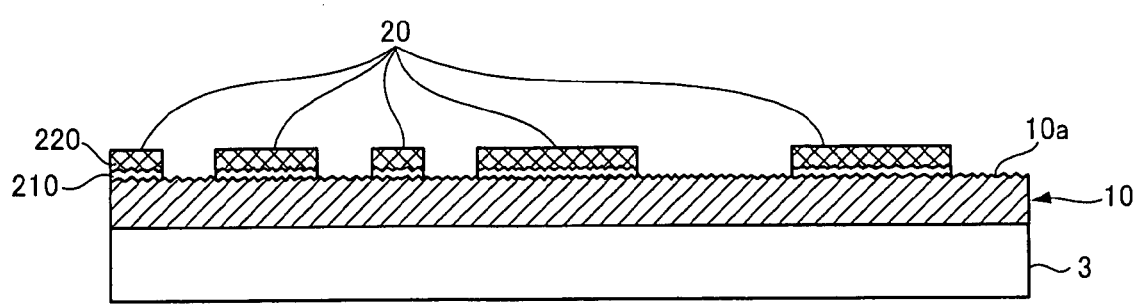
FIG. 1 is a cross-sectional diagram of a substrate showing a state after a first step of a laminating step is carried out.

FIG. 1 is a cross-sectional diagram of a substrate showing a state after a first step of a laminating is carried out.

FIG. 1 shows a core board 3, and a first insulation layer 10 provided on the core board 3. The first insulation layer 10 is formed by pasting an epoxy resin sheet onto a conductive pattern 20, and heating the pasted sheet. The whole surface 10a of the first insulation layer shown in FIG. 1 is roughened by chemical processing using manganese peroxide. FIG. 1 also shows a conductive pattern 20 provided in contact with the surface 10a of the roughened first insulation layer. The conductive pattern 20 has two layers including an electroless-plated layer 210 in contact with the surface of the first insulation layer, and an electroplated layer 220 laminated on the electroless-plated layer 210. The electroless-plated layer 210 is a conductive layer formed by copper plating the surface 10a of the first insulation layer in the electroless state. Because this layer is formed by electroless plating, the layer has very small thickness. On the other hand, the electroplated layer 220 contains copper as a main component, which is formed by electric plating using the electroless-plated layer 210. Because the electroplated layer 220 is formed by electric plating, this layer can have a larger thickness than that of the electroless-plated layer 210. Substantially the whole thickness of the conductive pattern 20 shown in FIG. 1 is the thickness of the electroplated layer 220. Although not shown in FIG. 1, a layer formed by alternately laminating a first insulation layer and a conductive pattern is provided beneath the first insulation layer 10. In other words, FIG. 1 shows the first insulation layer 10 and the conductive pattern 20 that are formed last, after carrying out by plural times, the process including the forming of a first insulation layer, the roughening of the whole surface of the formed first insulation layer, and the forming of a desired conductive pattern on the roughened surface of the first insulation layer.

At the laminating step, a second step is carried out after the first step. At the second step, a second insulation layer is laminated on the conductive pattern 20 that is formed last.

Figure 2:
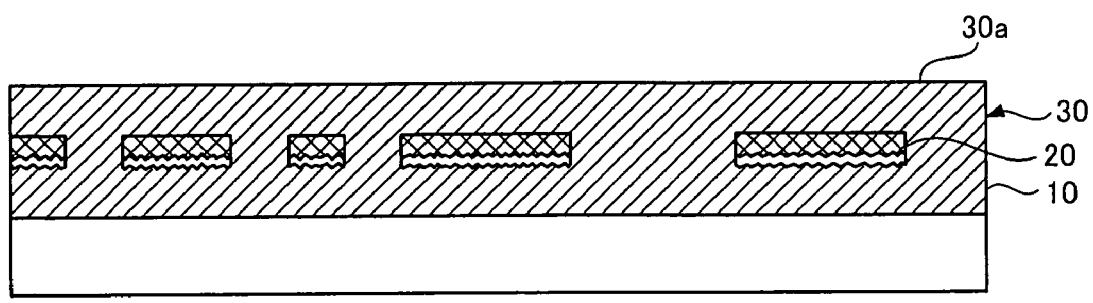
FIG. 2 is a cross-sectional diagram of the substrate showing a state that a second insulation layer is laminated on a conductive pattern shown in FIG. 1.

FIG. 2 is a cross-sectional diagram of the substrate showing a state that the second insulation layer is laminated on the conductive pattern shown in FIG. 1.

A second insulation layer 30 is formed by pasting an epoxy resin sheet onto the conductive pattern 20, and heating the pasted sheet, like the first insulation layer 10. At the second step, after the second insulation layer 30 is laminated, a surface 30a of the laminated second insulation layer is roughened excluding a desired area. Before roughening the surface, a via hole is formed on the second insulation layer 30.

Figure 3:
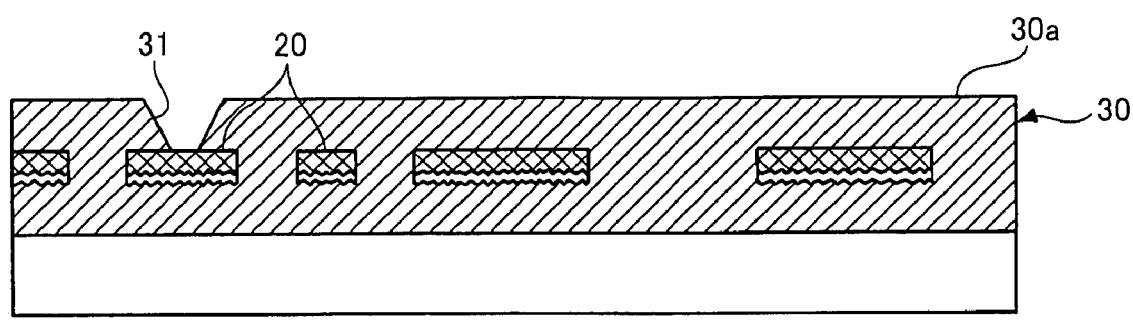
FIG. 3 is a cross-sectional diagram of the substrate showing a state that via holes are formed on the second insulation layer shown in FIG. 2.

FIG. 3 is a cross-sectional diagram of the substrate showing a state that the via holes are formed on the second insulation layer shown in FIG. 2.

A laser processing is carried out to the exposed surface 30a of the second insulation layer to form a via hole 31 that leads to a part of the conductive pattern 20 adjacent to a lower surface of the second insulation layer 30. After forming the via hole, the surface of the second insulation layer is roughened at the second step. In order to selectively roughen the surface of the second insulation layer, a resist film is pasted to this surface.

Figure 4:
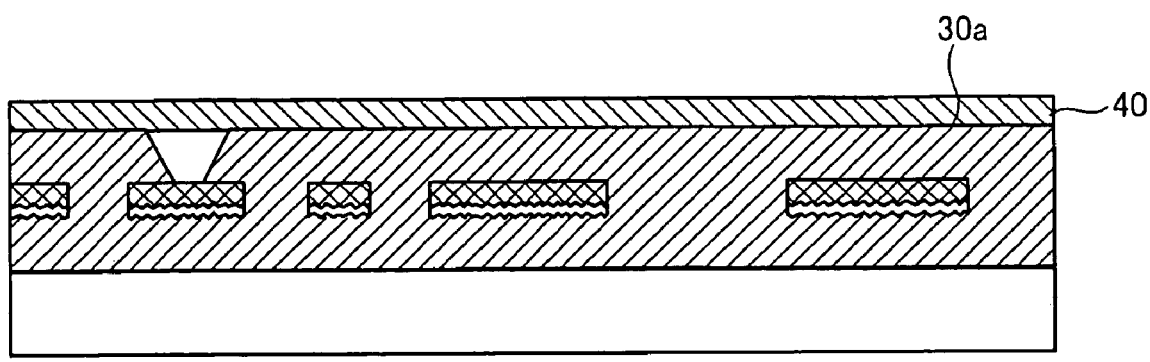
FIG. 4 is a cross-sectional diagram of the substrate showing a state that a resist film is pasted to the surface of the second insulation layer shown in FIG. 3.

FIG. 4 is a cross-sectional diagram of the substrate showing a state that the resist film is pasted to the surface of the second insulation layer shown in FIG. 3.

A resist film 40 is pasted to cover the whole exposed surface 30a of the second insulation layer. This resist film 40 is exposed and developed.

Figure 5:
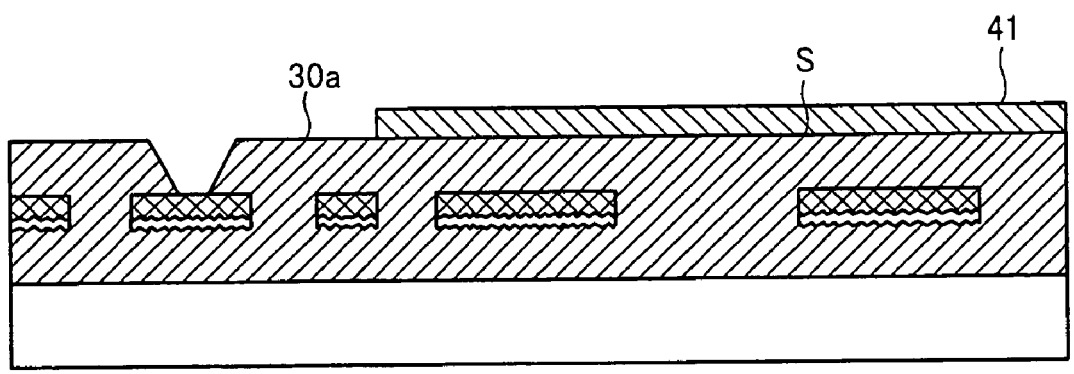
FIG. 5 is a cross-sectional diagram of the substrate showing a state that the resist film shown in FIG. 4 is exposed and developed.

FIG. 5 is a cross-sectional diagram of the substrate showing a state that the resist film shown in FIG. 4 is exposed and developed.

The resist film 40 shown in FIG. 4 is provided to mask a desired area S of the surface 30a of the second insulation layer. FIG. 5 shows a mask 41 of the resist film formed on the desired area S. The surface 30a of the second insulation layer excluding the masked desired area S is roughened.

Figure 6:
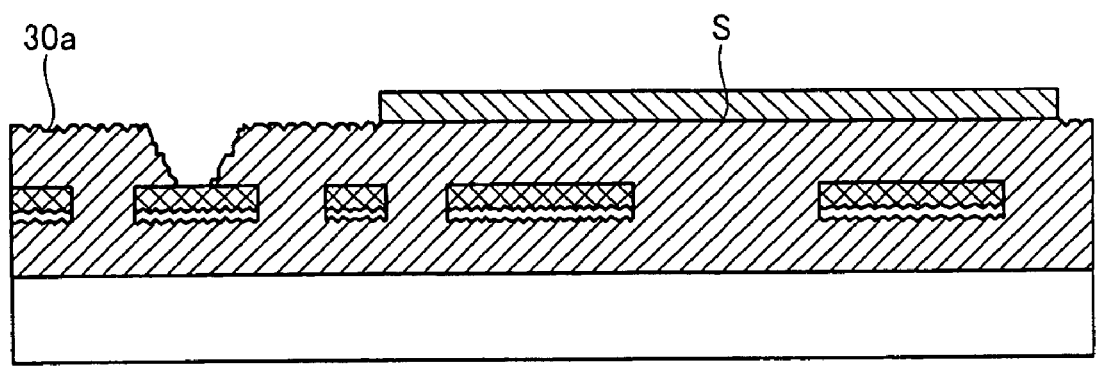
FIG. 6 is a cross-sectional diagram of the substrate showing a state that the surface of the second insulation layer shown in FIG. 5 is roughened, with a desired area masked.

FIG. 6 is a cross-sectional diagram of the substrate showing a state that the surface of the second insulation layer shown in FIG. 5 is roughened, with the desired area masked.

The surface 30a of the second insulation layer is roughened by chemical processing using manganese peroxide. The masked desired area S is not roughened, and the original surface state is maintained. The mask 41 of the desired area S is removed using a release agent.

Figure 7:
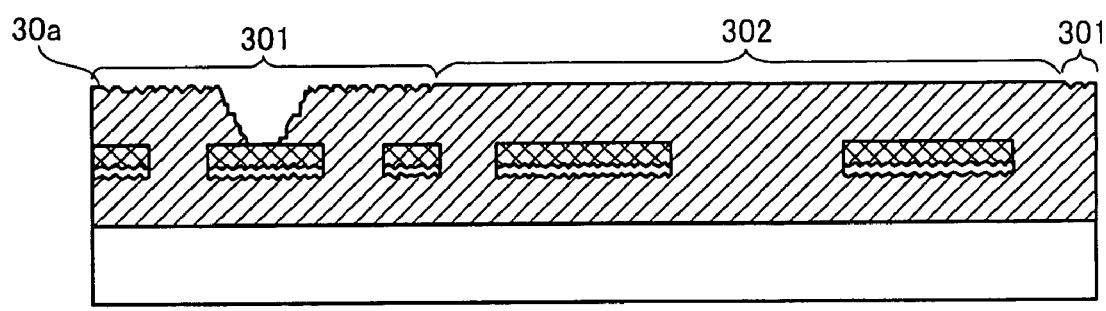
FIG. 7 is a cross-sectional diagram of the substrate showing a state that after the surface is roughened, the mask of the resist film formed on the desired area is removed.

FIG. 7 is a cross-sectional diagram of the substrate showing a state that after the surface is roughened, the mask of the resist film formed on the desired area is removed.

In FIG. 7, the exposed surface 30a of the second insulation layer has a roughened part 301 and a non-roughened part 302. After selectively roughening the surface 30a of the second insulation layer, a seed layer is formed as a conductive layer at the second step.

Figure 8:
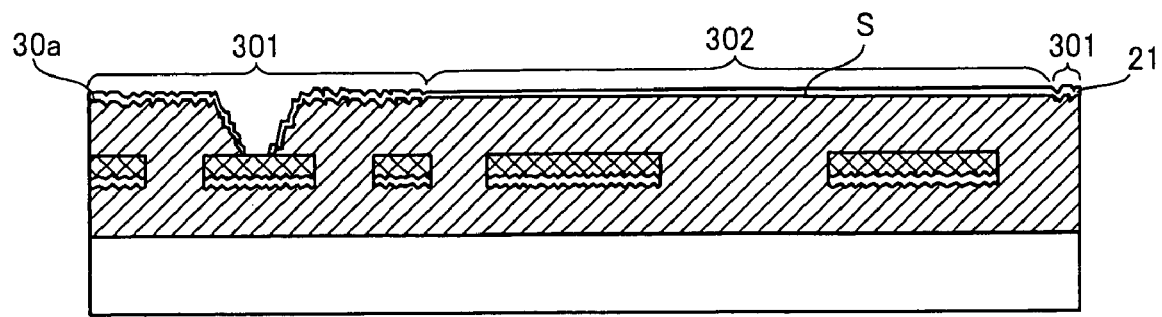
FIG. 8 is a cross-sectional diagram of the substrate showing a state that a seed layer is formed on the exposed whole surface of the second insulation layer shown in FIG. 7.

FIG. 8 is a cross-sectional diagram of the substrate showing a state that the seed layer is formed on the exposed whole surface of the second insulation layer shown in FIG. 7.

The exposed whole surface 30a of the second insulation layer is electroless copper plated to form a thin seed layer 21. The seed layer 21 is strongly adhered to the roughened part 301, and is weakly adhered to the non-roughened part 302, that is, the desired area S. Therefore, the seed layer 21 can be easily removed from this part 302. At the second step, in order to selectively provide an electroplated layer on the seed layer 21, a resist film is pasted to the seed layer, and is exposed and developed.

Figure 9:
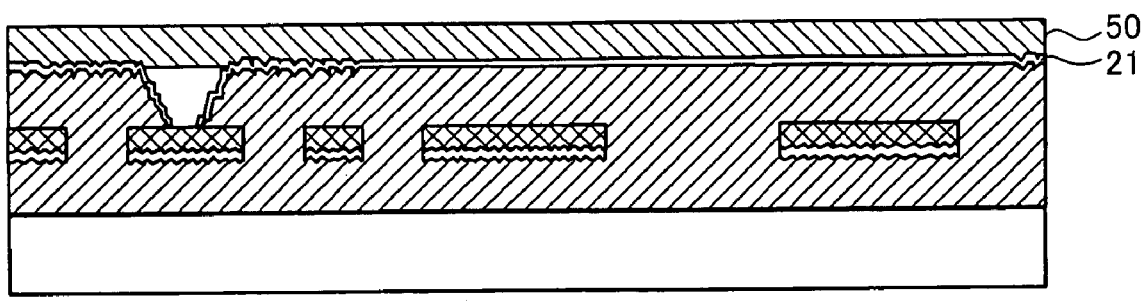
FIG. 9 is a cross-sectional diagram of the substrate showing a state that a resist film is pasted to the surface of the seed layer shown in FIG. 8.
Figure 10:
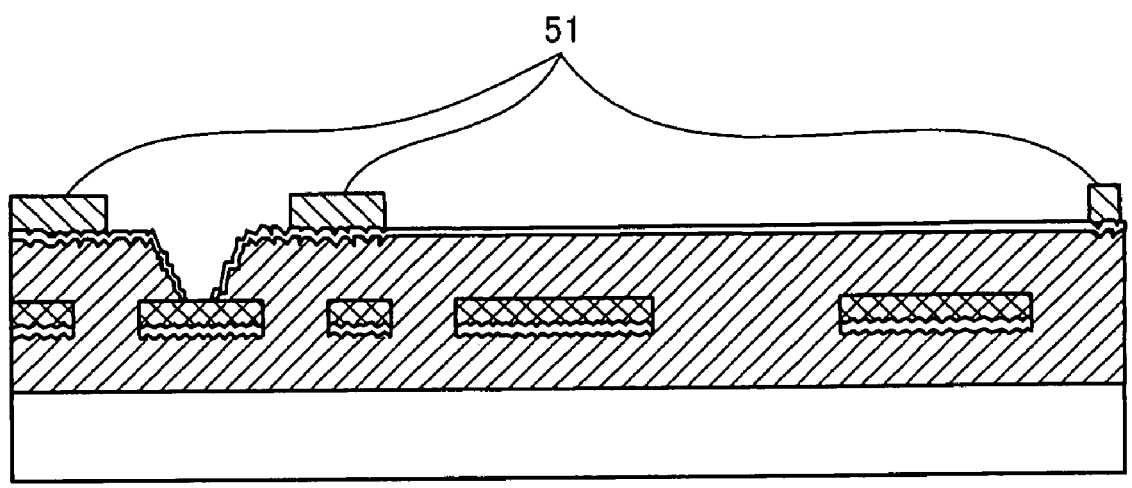
FIG. 10 is a cross-sectional diagram of the substrate showing a state that the resist film shown in FIG. 9 is exposed and developed.

FIG. 9 is a cross-sectional diagram of the substrate showing a state that the resist film is pasted to the surface of the seed layer shown in FIG. 8. FIG. 10 is a cross-sectional diagram of the substrate showing a state that the resist film shown in FIG. 9 is exposed and developed.

In FIG. 9, a resist film 50 is provided to mask a desired part of the seed layer 21. FIG. 10 shows a mask 51 of the resist film formed on the desired area. The exposed part of the seed layer 21 formed with the mask 51 is electroplated, thereby forming an electroplated layer 220 containing copper as a main component. The seed layer 21 plays the same role as that of the electroless-plated layer 210 of the conductive pattern 20 shown in FIG. 1.

Figure 11:
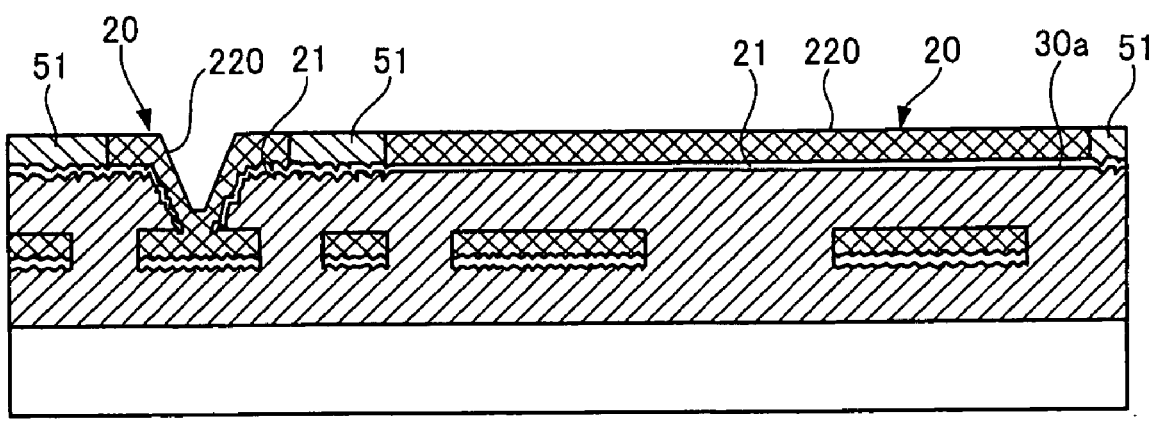
FIG. 11 is a cross-sectional diagram of the substrate showing a state that an electroplated layer is formed on an exposed part of the seed layer.

FIG. 11 is a cross-sectional diagram of the substrate showing a state that the electroplated layer is formed on the exposed part of the seed layer.

FIG. 11 shows two conductive patterns 20 formed on the surface 30a of the second insulation layer. Each conductive pattern 20 includes a part of the seed layer 21 and the electroplated layer 220. At the last step of the second step, the mask 51 of the resist film is removed using a releasing agent, and a part of the seed layer 21 exposed after removing the mask 51 is further removed by etching.

Figure 12:
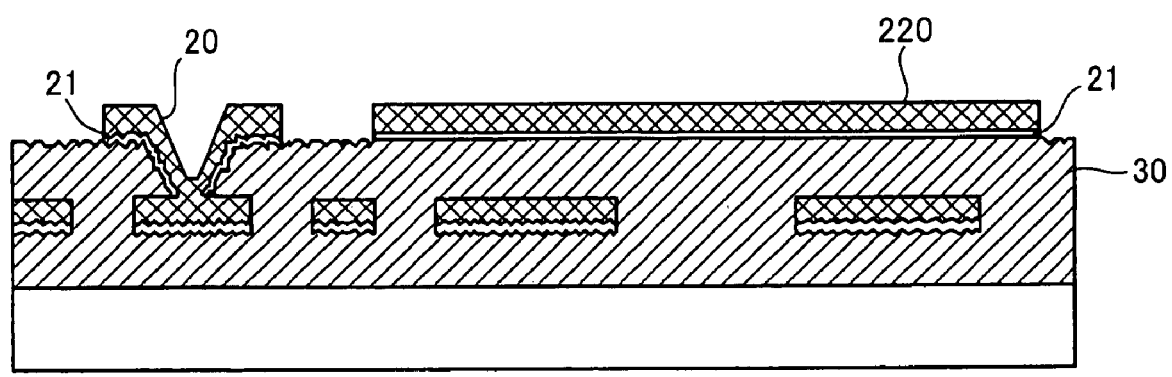
FIG. 12 is a cross-sectional diagram of the substrate showing a state after a second step is carried out.

FIG. 12 is a cross-sectional diagram of the substrate showing a state after the second step is carried out.

In FIG. 12, the exposed part of the second insulation layer 30 is roughened.

At t the laminating step, a third step is carried out after the second step. The third step includes forming a third insulation layer on the seed layer 21 formed at the second step, that is, via the electroplated layer 220, roughening the whole surface of the formed third insulation layer, and forming a desired conductive pattern on the roughened surface of the third insulation layer, as one cycle, or further forming the next third insulation layer on the formed conductive pattern, thereby repeating the cycle more than once.

Figure 13:
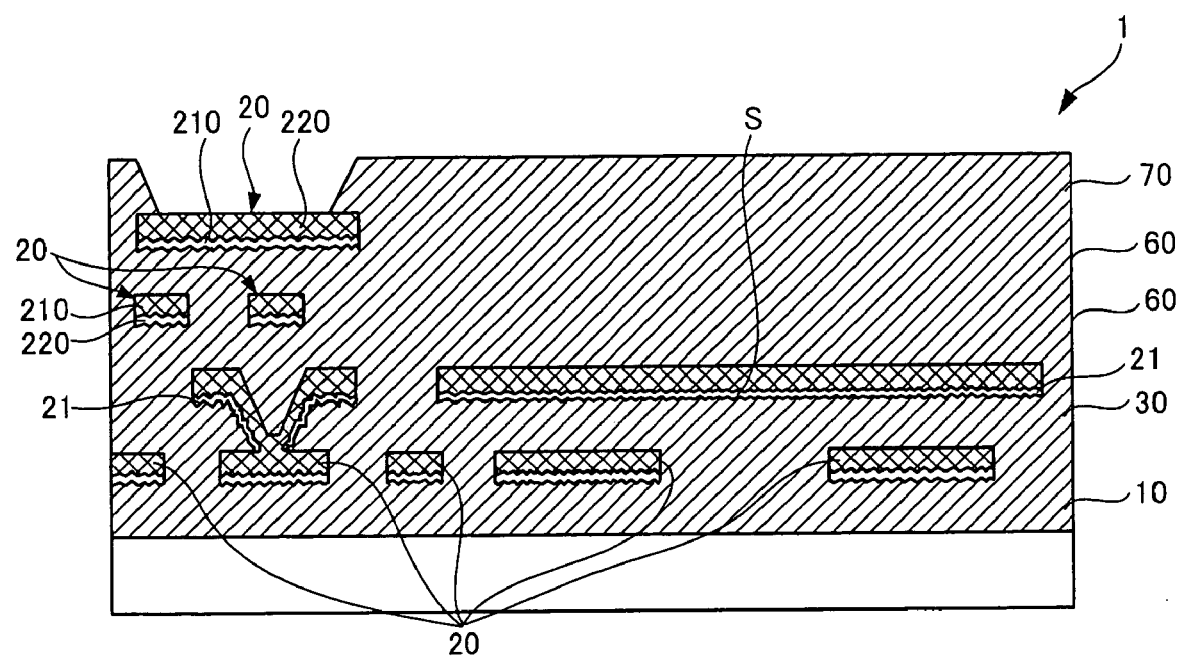
FIG. 13 is a cross-sectional diagram of the substrate showing a state that a third step is repeated twice, and further a fourth insulation layer is laminated.

FIG. 13 is a cross-sectional diagram of the substrate showing a state that the third step is repeated twice, and further a fourth insulation layer is laminated.

FIG. 13 shows two third insulation layers 60, and conductive patterns 20 provided on the surface of the third insulation layers 60. Each third insulation layer 60 has the roughened part. In FIG. 13, a fourth insulation layer (i.e., a top layer) 70 is formed on the surface of the conductive pattern 20 provided on the surface of one third insulation layer 60 positioned higher than the other third insulation layer 60. The third insulation layers 60 and the fourth insulation layer 70 are formed by pasting an epoxy resin sheet onto the conductive pattern 20, and heating the pasted sheet, like the first insulation layer 10. The conductive pattern 20 formed on the surface of the third insulation layer 60 includes the electroless-plated layer 210 and the electroplated layer 220, like the conductive pattern 20 formed on the surface of the first insulation layer 10. The above completes the laminating step in the method of manufacturing a substrate according to the present embodiment.

The processing step is explained next. The processing step includes a removing step and an exposing step. The removing step is a step of removing an upper part of the desired area S on the upper layer than the second insulation layer 30 on the substrate 1 shown in FIG. 13 obtained at the laminating step. First, holes are formed along the external periphery of the upper part of the desired area S higher than the second insulation layer 30, thereby forming a cut C.

Figure 14:
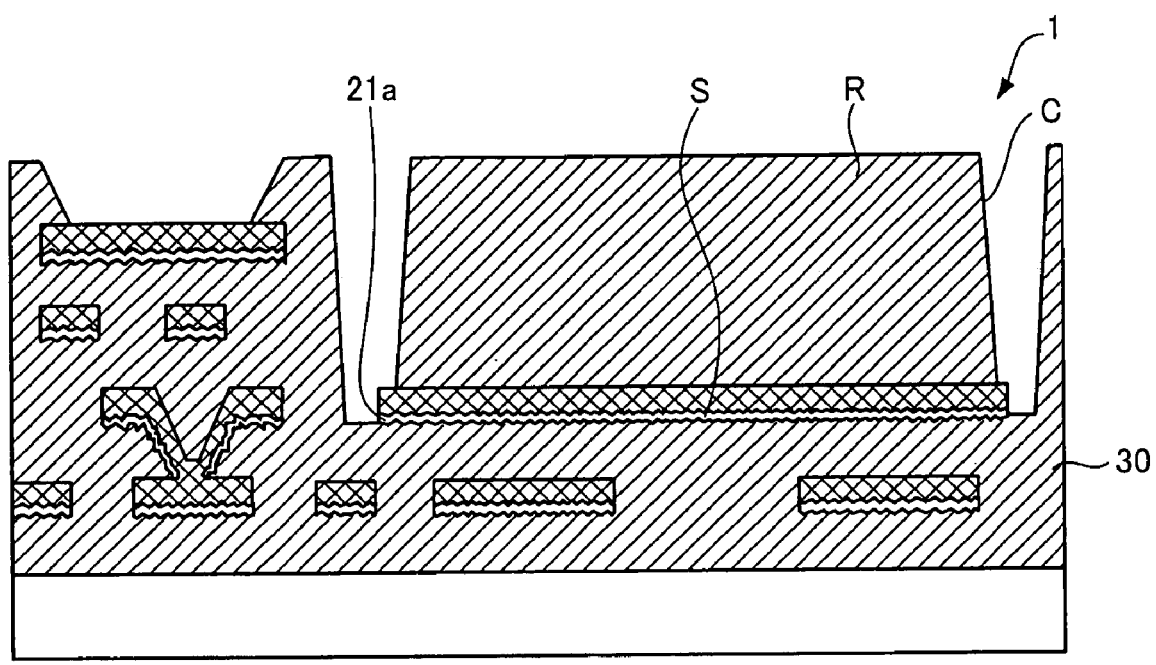
FIG. 14 is a cross-sectional diagram of the substrate showing a state that a cut is formed on the substrate shown in FIG. 13 obtained at the laminating step.

FIG. 14 is a cross-sectional diagram of the substrate showing a state that the cut is formed on the substrate shown in FIG. 13 obtained at the laminating step.

In FIG. 14, a part 21a of the seed layer formed on the substrate 1, that is in contact with the non-roughened desired area S of the second insulation layer 30, has a weak adhesion to the second insulation layer 30. Therefore, when the cut C is formed as shown in FIG. 14, an upper part R of the desired area S higher than the second insulation layer 30 can be easily removed from the second insulation layer 30. After the cut C is formed, this part R is mechanically removed.

Figure 15:
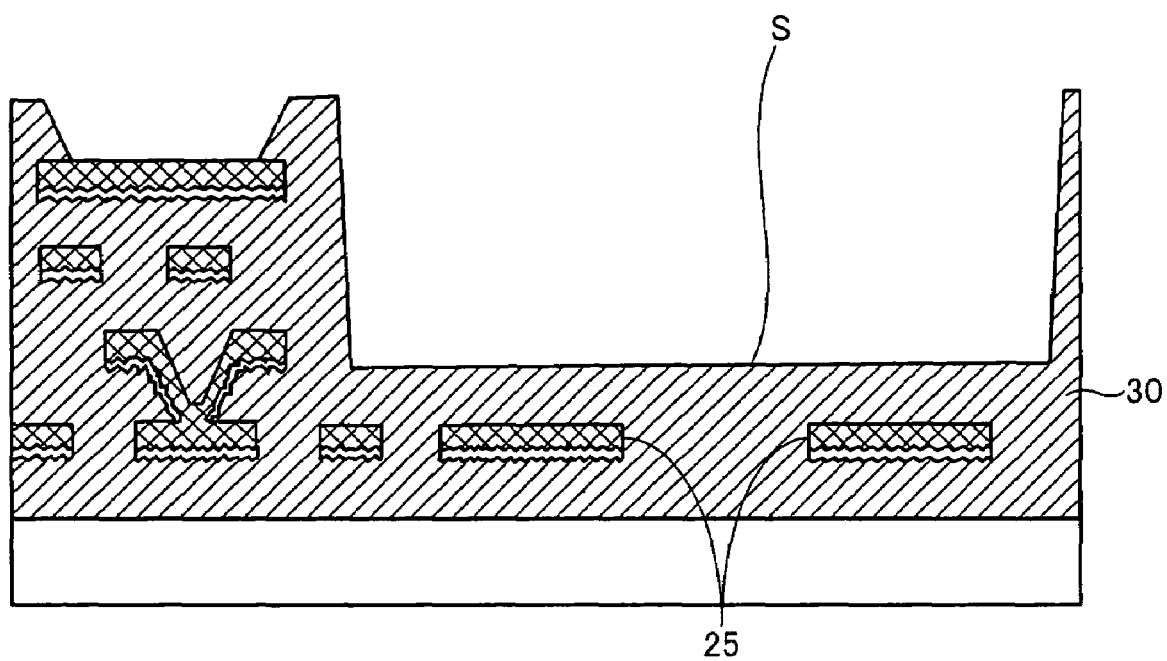
FIG. 15 is a cross-sectional diagram of the substrate showing a state after a removing step is carried out.

FIG. 15 is a cross-sectional diagram of the substrate showing a state after the removing step is carried out.

FIG. 15 shows a state that the non-roughened desired area S of the second insulation layer 30 is exposed. Because the upper part R of the desired area S higher than the second insulation layer 30 shown in FIG. 14 is mechanically removed, the seed layer slightly remains on the desired area S of the second insulation layer 30 in some cases. In this case, the remaining seed layer can be removed completely by chemically etching the desired area S. After ending the removing step, the exposing step is carried out. At the exposing step, pads within the desired area S of the conductive pattern 20 adjacent to a lower part of the second insulation layer 30 are exposed. A laser beam is irradiated to the surface of the exposed desired area S of the second insulation layer 30, thereby forming through-holes leading to the pads 25 from the surface. Preferably, ultraviolet rays are used to prevent carbonization of the resin material of the second insulation layer 30.

Figure 16:
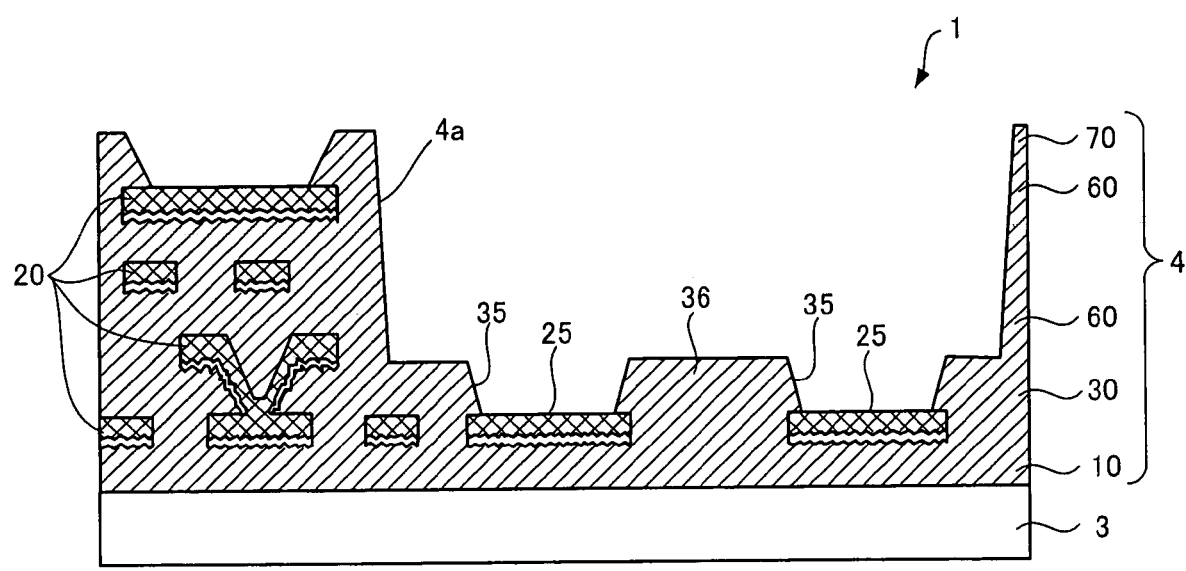
FIG. 16 is a cross-sectional diagram of the substrate showing a state after an exposing step is carried out.

FIG. 16 is a cross-sectional diagram of the substrate showing a state after the exposing step is carried out.

In FIG. 16, through-holes 35 are formed on the substrate 1, thereby exposing the pads of the conductive pattern. The substrate 1 shown in FIG. 16 corresponds to a circuit board of the embodiment of the present invention. In other words, in FIG. 16, the substrate 1 includes the core board 3, on which the insulation layers 10, 60, and 70, and the conductive pattern 20 are laminated alternately to form the buildup layer 4. According to the buildup layer 4 shown in FIG. 16, a part accommodating the noise reduction element (hereinafter referred to as a removal area 4a) higher than the conductive pattern 20 to be connected, lower than the fourth insulation layer (i.e., the top layer), to which the noise reduction element is to be connected, is removed, thereby exposing the conductive pattern 20 to be connected.

At the exposing step, the through-holes 35 corresponding to the thickness of the second insulation layer 30 are formed. A distance between the pads 25 and the exposed surface above the pads 25 is small. A mechanical cut processing has a high processing capacity, but scatters a cut waste of the pads, and roughens the surface of the pads. At this exposing step, a laser processing is carried out to avoid scattering of a cut waste of the pads and roughening the pad surface, despite inferior processing capacity to the mechanical cutting. As a result, the through-holes can be formed at low cost in a short time. Consequently, the pads 25 can be exposed at low cost in a short time, without scattering the cut waste of the pads 25 and without roughening the surface of the pads 25.

FIG. 16 shows a state that two pads 25 are exposed with a distance between them. A part 36 of the second insulation layer 30 remains between the two pads 25. The part 36 can be removed at the exposing step, when the distance between the two pads 25 is small and also when the removal is permitted from the viewpoint of cost and productivity. The through-holes 35 can be formed according to any other method than the laser processing, when the through-holes are formed at low cost and in high productivity and so long as the cut waste of the pads is not scattered and the pad surface is not roughed.

The noise reduction element mounting step is explained next. At the noise reduction element mounting step, a noise reduction element is connected to the part (i.e., the pads 25) within the desired area S of the conductive pattern 20 exposed at the exposing step.

Figure 17:
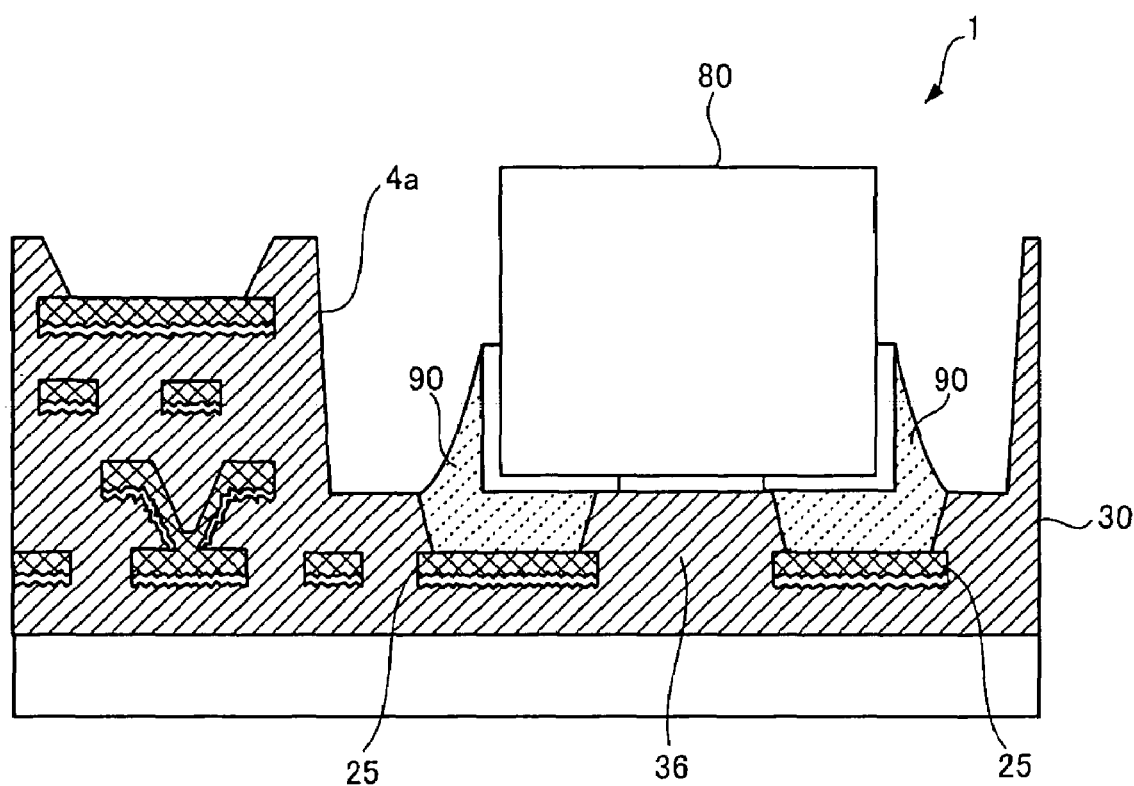
FIG. 17 is a cross-sectional diagram of the substrate showing a state after a noise reduction element mounting step is carried out.

FIG. 17 is a cross-sectional diagram of the substrate showing a state after the noise reduction element mounting step is carried out.

In FIG. 17, a noise reduction element 80 is mounted on the part 36 that remains between the two pads 25 of the second insulation layer 30. The mounted noise reduction element 80 is electrically connected to the pads 25 with solder 90. The substrate 1 shown in FIG. 17 corresponds to a circuit board according to another embodiment of the present invention. In FIG. 17, the substrate 1 includes the noise reduction element 80 that is connected to the conductive pattern 20 to be connected, and is accommodated in the removal part 4a.

In FIG. 17, pads not shown corresponding to the pads 25, to which the noise reduction element 80 is connected, are provided at a side opposite to the side where the noise reduction element 80 is mounted on the substrate 1. An LSI (large scale integration) chip is soldered to the corresponding pads.

Figure 18:
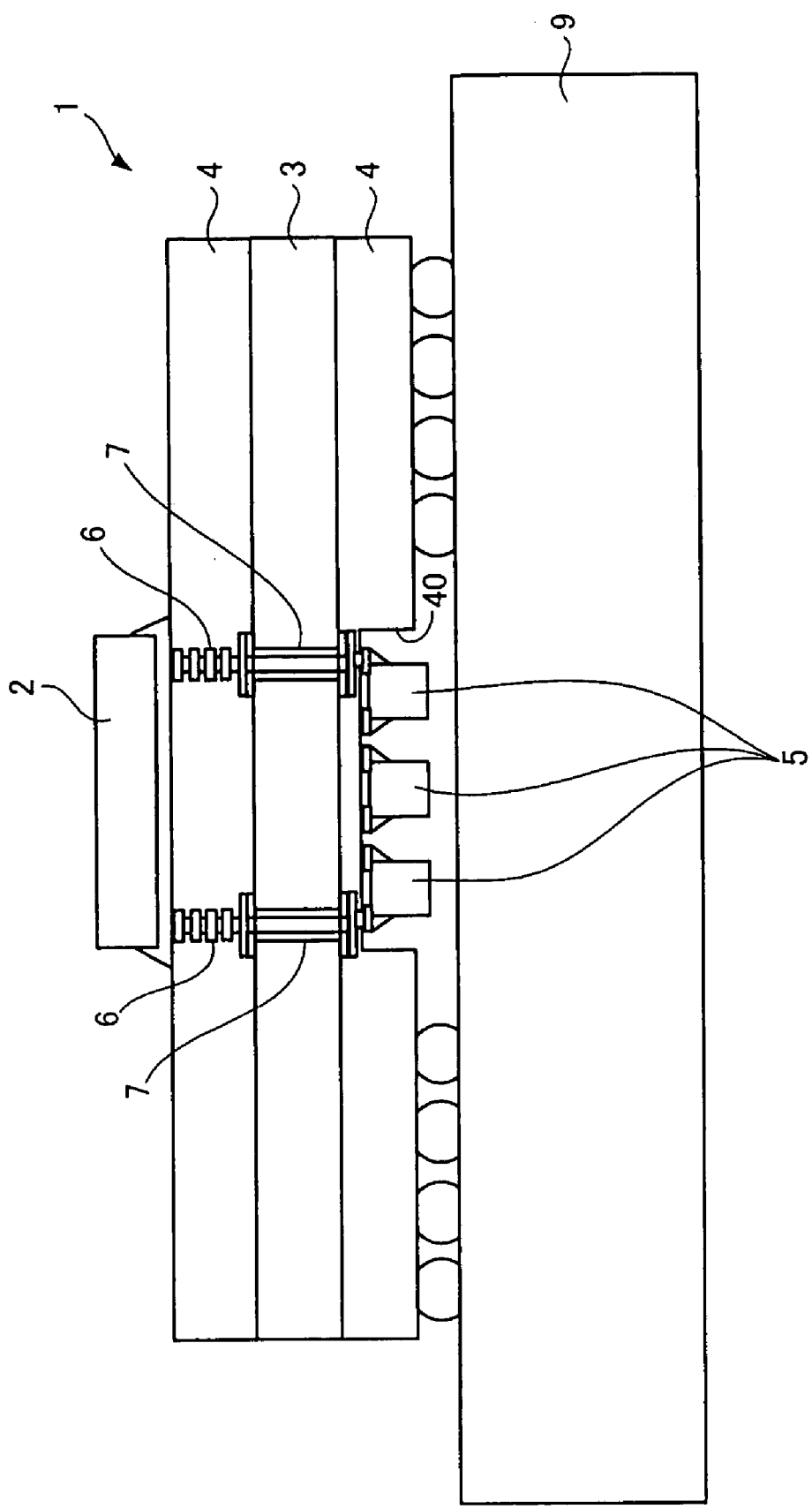
FIG. 18 is a cross-sectional diagram of a substrate mounted on a mother board, a circuit board according to the embodiment of the present invention.
Figure 19:
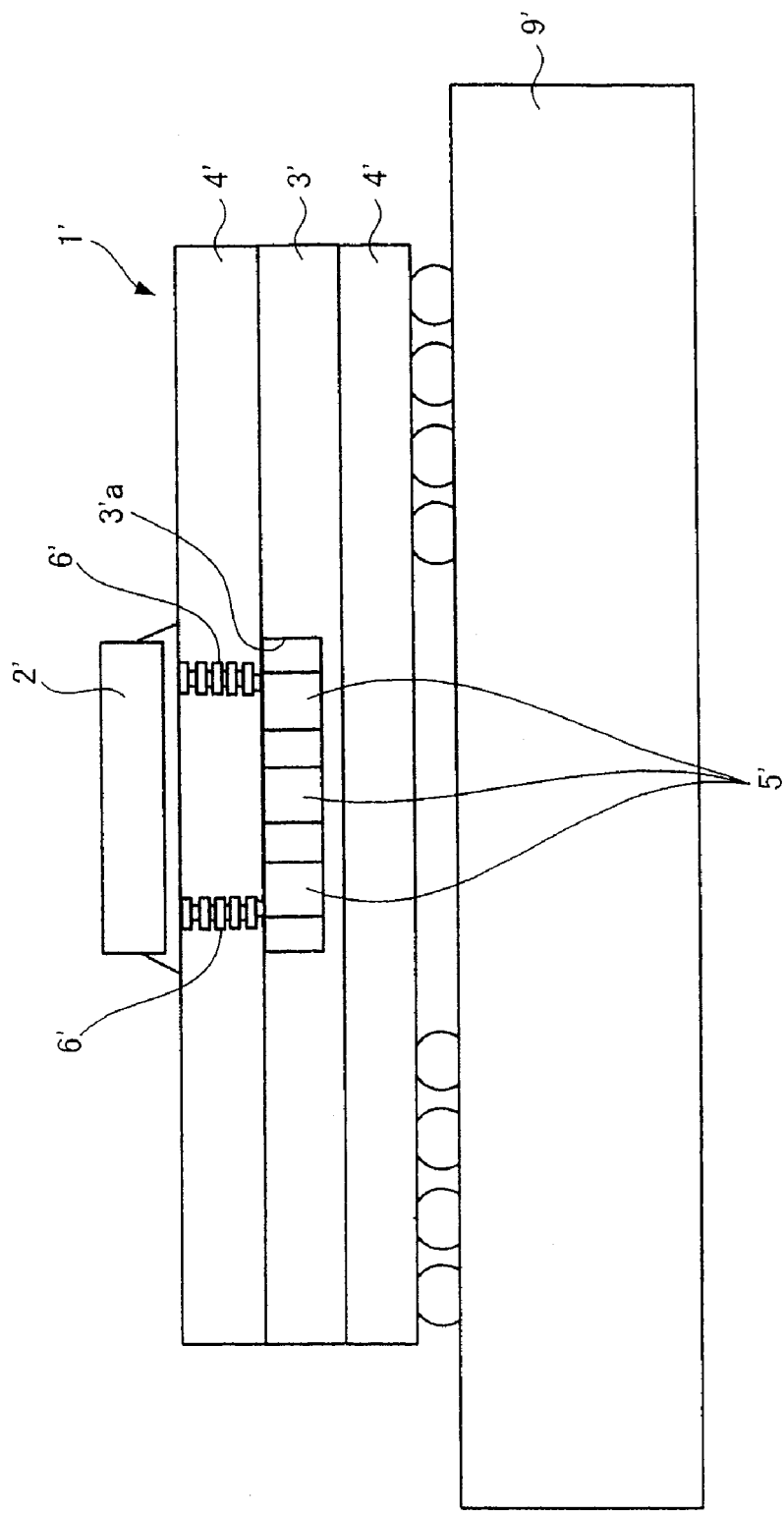
FIG. 19 is a schematic diagram of a circuit board having chip capacitors embedded in a core board by applying a technique described in a draft at NE/NμD Hardware Conference 2002.

FIG. 18 is a cross-sectional diagram of a substrate mounted on a mother board, according to a circuit board according to the embodiment of the present invention.

FIG. 18 shows the core board 3 and the buildup layers 4 provided on both the upper surface and the lower surface of the core board 3 to constitute the substrate 1. In FIG. 18, of the two buildup layers 4, the buildup layer 4 positioned at the mother board 9 side is manufactured according to the above substrate manufacturing method. In FIG. 18, the LSI chip 2 is mounted on the surface of the substrate 1. Chip capacitors 5 accommodated on the removal part 4a of the buildup layer 4 are connected to the LSI chip 2 through the via holes 6 and through-holes 7 around which the conductor is provided. The substrate 1 shown in FIG. 18 has a thickness that does not cause a trouble in handling. A part of the substrate on which the chip capacitors 5 are mounted has a small thickness in the thickness direction of the substrate, thereby reducing a distance between the LSI chip 2 mounted on the opposite side and the chip capacitor 5. Therefore, the substrate 1 shown in FIG. 18 has a high noise-reduction rate of the chip capacitors 5.

What is claimed is:

1. A circuit board comprising:
    a core board having an insulation layer and a conductive pattern laminated alternately on the core board; and
    a buildup layer, wherein
    the buildup layer is configured such that a part of an insulating layer, accommodating a passive element, which is higher than a conductive pattern to be connected to the passive element present in a layer lower than a top layer of the buildup layer, is removed and the conductive pattern to be connected to the passive element is exposed.

2. The circuit board according to claim 1, further comprising a passive element that is connected to the conductive pattern, and is accommodated on a remaining portion of the insulating layer from which a part is removed.

3. The circuit board according to claim 2, wherein the passive element is a chip capacitor.

4. The circuit board according to claim 3, further comprising a semiconductor chip that is connected to the chip capacitor.

* * * * *